(12) United States Patent
Nishikawa

(10) Patent No.: US 8,164,203 B2
(45) Date of Patent: Apr. 24, 2012

(54) LEADFRAME, SEMICONDUCTOR DEVICE, AND METHOD OF MANUFACTURING THE SAME

(75) Inventor: Kenji Nishikawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 118 days.

(21) Appl. No.: 12/458,951

(22) Filed: Jul. 28, 2009

(65) Prior Publication Data
US 2010/0025839 A1    Feb. 4, 2010

(30) Foreign Application Priority Data
Aug. 1, 2008    (JP) ................................. 2008-199186

(51) Int. Cl.
*H01L 23/544*    (2006.01)

(52) U.S. Cl. ........ 257/797; 257/670; 257/676; 257/777; 257/E23.179

(58) Field of Classification Search .................. 438/111, 438/112, 123, FOR. 366, FOR. 367, FOR. 380; 257/666–677, E23.004, E23.031, E25.005, 257/E25.006, E25.011, E25.013, E25.015, 257/723, 797, 777, 686, 685
See application file for complete search history.

(56) References Cited

U.S. PATENT DOCUMENTS

| | | | | |
|---|---|---|---|---|
| 6,081,029 A * | 6/2000 | Yamaguchi | .................. | 257/718 |
| 6,740,961 B1 * | 5/2004 | Mostafazadeh | ............... | 257/676 |
| 6,891,254 B2 * | 5/2005 | Taniguchi | ..................... | 257/667 |
| 6,900,524 B1 * | 5/2005 | Minamio et al. | ............. | 257/669 |
| 7,262,491 B2 * | 8/2007 | Islam et al. | .................. | 257/670 |
| 2003/0092216 A1 * | 5/2003 | Lee et al. | ...................... | 438/106 |

FOREIGN PATENT DOCUMENTS

| | | |
|---|---|---|
| JP | 62-163962 | 10/1987 |
| JP | 2007-134659 | 5/2007 |

* cited by examiner

*Primary Examiner* — Jasmine Clark
(74) *Attorney, Agent, or Firm* — McGinn Intellectual Property Law Group, PLLC

(57) ABSTRACT

A leadframe has a die pad, first marks, and second marks, and the die pad allows thereon mounting of a first semiconductor chip. The first marks indicate a mounting region for the first semiconductor chip, the second marks indicate a mounting region for the second semiconductor chip, and the first marks and the second marks are different from each other in at least either one of size and geometry.

36 Claims, 8 Drawing Sheets

LEADFRAME, SEMICONDUCTOR DEVICE, AND METHOD OF MANUFACTURING THE SAME

This application is based on Japanese patent application No. 2008-199186, the content of which is incorporated hereinto by reference.

BACKGROUND

1. Technical Field

The present invention relates to a leadframe allowing thereon easy confirmation of mounting positions of semiconductor chips, a semiconductor device, and a method of manufacturing a semiconductor device.

2. Related Art

Semiconductor devices, having a semiconductor chip mounted on a leadframe, need mounting of the semiconductor chip with a good positional accuracy. Easy confirmation of a mounting position of the semiconductor chip makes easy screening of defective products.

For example, Japanese Laid-Open Utility Publication No. 62-163962 describes a technique of providing a die island (die pad) with recesses or projections which serve as marks for positioning a semiconductor chip. Japanese Laid-Open Patent Publication No. 2007-134659 discloses a technique of forming trenches on a die pad, and outside a mounting region for a semiconductor chip.

A single leadframe may have a plurality of semiconductor chips mounted thereon. Alternatively, a single type of leadframe may have different types of semiconductor chips respectively mounted thereon, to thereby manufacture several types of semiconductor devices. In these cases, it may be preferable that mounting positions of the plurality of types of semiconductor chips may readily be identified.

SUMMARY

In one embodiment, there is provided a leadframe which includes a die pad on which semiconductor chips are mounted;

a first mark formed to said die pad, for indicating a first mounting region for a first semiconductor chip; and a second mark formed to said die pad, for indicating a second mounting region for a second semiconductor chip;

wherein said first mark is different from said second mark in at least either one of size and geometry.

According to the present invention, the first marks are different from the second marks, in at least either one of size and geometry. Accordingly, the individual mounting positions of the first semiconductor chip and the second semiconductor chip may readily be identified.

In another embodiment, there is provided also a semiconductor device which includes:

the above-described leadframe; and the first semiconductor chip mounted on the die pad of the leadframe.

In another embodiment, there is provided still also a method of manufacturing a semiconductor device, the method includes:

mounting at least one of a first semiconductor chip and a second semiconductor chip over a die pad of a leadframe; and inspecting a mounting position of at least one of said first semiconductor chip and said second semiconductor chip;

wherein said leadframe comprising:

first mark formed to said die pad, for indicating a first mounting region for said first semiconductor chip; and second mark formed to said die pad, for indicating a second mounting region for said second semiconductor chip;

said first mark is different from said second mark, in at least either one of size and geometry, wherein, in said inspecting a mounting position of at least one of said first semiconductor chip and said second semiconductor chip, a mounting position of said first semiconductor chip is inspected when said first semiconductor chip is mounted, based on a relative position of said first semiconductor chip with respect to said first mark, and a mounting position of said second semiconductor chip is inspected when said second semiconductor chip is mounted, based on a relative position of said second semiconductor chip with respect to said second mark.

According to the present invention, the individual mounting positions of the first semiconductor chip and the second semiconductor chip may readily be identified.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
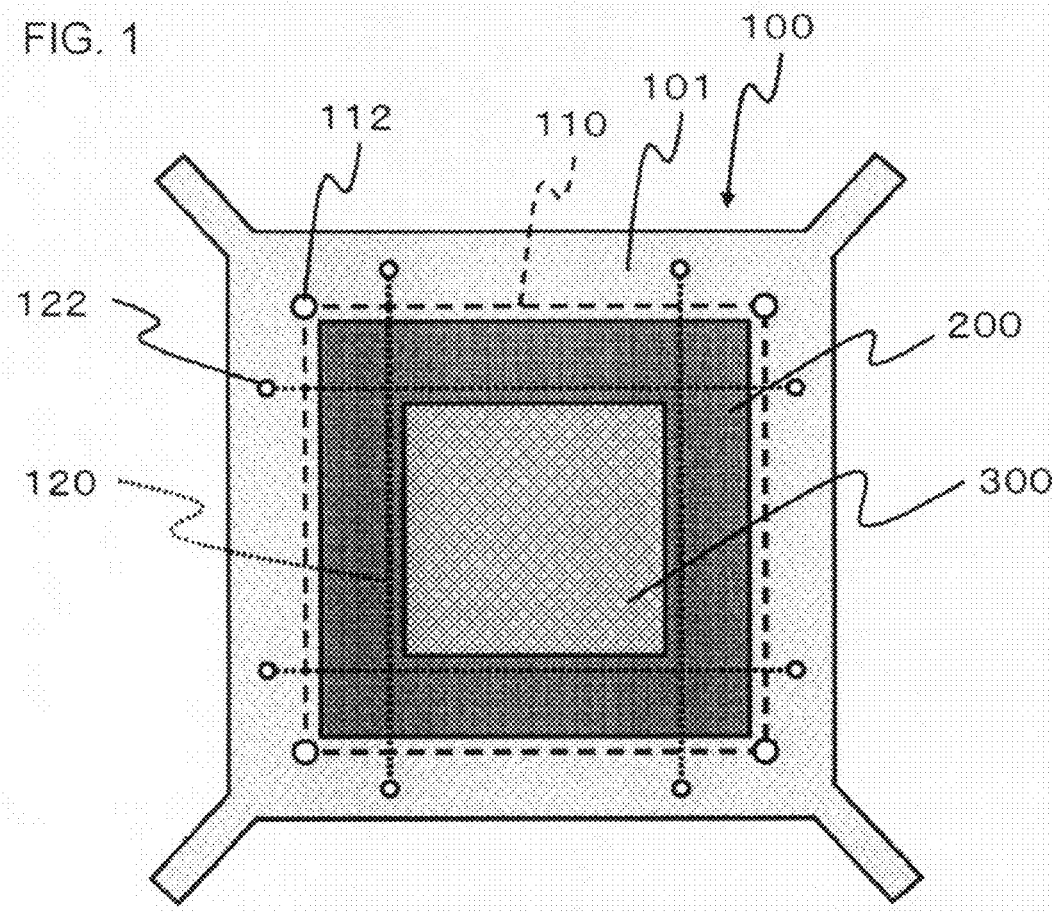
FIG. 1 is a plan view of a semiconductor device according to a first embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that any similar constituents will be given with similar reference numerals or symbols in all drawings, so that explanations therefor will not be repeated.

FIG. 1 is a plan view of a semiconductor device according to a first embodiment. The semiconductor device has a leadframe 100, a first semiconductor chip 200, and a second semiconductor chip 300. The leadframe 100 has a die pad 101, first marks 112, and second marks 122. The die pad 101 allows thereon mounting of the first semiconductor chip 200. The first marks 112 indicate a mounting region 110 for the first semiconductor chip 200, and the second marks 122 indicate a mounting region 120 for the second semiconductor chip 300. The first marks 112 are different from the second marks 122 in at least size and geometry. In this illustrated example, the first mark 112 and the second mark 122 have nearly circular geometry, but have different sizes. More specifically, the first marks 112 are larger than the second marks 122.

Note that first recesses, projections or holes may be adoptable in place of the first marks 112, and second recesses, projections or holes may be adoptable in place of the second marks 122.

The first recesses 112 and the second recesses 122 typically have diameters of equal to or larger than 0.05 mm and equal to or smaller than 0.3 mm, and typically have depths of equal to or deeper than 0.01 mm and equal to or shallower than 0.05 mm. All of the first recesses 112 and the second recesses 122 are positioned outside the mounting region 110 for the first semiconductor chip 200, and outside the mounting region 120 for the second semiconductor chip 300.

In this illustrated example, the second semiconductor chip 300 is smaller than the first semiconductor chip 200, and is mounted over the first semiconductor chip 200. The mounting region 120 for the second semiconductor chip 300 is positioned inside the mounting region 110 for the first semiconductor chip 200.

The die pad 101 has a nearly square or rectangular geometry, and has a plurality of first recesses 112 and a plurality of second recesses 122. The mounting region 110 for the first semiconductor chip 200 is defined by the lines connecting every adjacent first recesses 112. The mounting region 120 for the second semiconductor chip 300 is defined by the lines connecting every correspondent second recesses 122 faced each other through the mounting region 110 for the first semiconductor chip 200 in between.

In this illustrated example, the mounting region 110 for the first semiconductor chip 200 defined by the first recesses 112 is larger than the first semiconductor chip 200, and indicates an allowable range of the mounting position of the first semiconductor chip 200. Also the mounting region 120 for the second semiconductor chip 300 defined by the second recesses 122 is larger than the second semiconductor chip 300, and indicates an allowable range of the mounting position of the second semiconductor chip 300. Alternatively, the mounting region 110 for the first semiconductor chip 200 may have the same geometry with the first semiconductor chip 200, so as to make the mounting region 110 indicate the mounting position of the first semiconductor chip 200 on the design basis. Still alternatively, the mounting region 120 for the second semiconductor chip 300 may have the same geometry with the second semiconductor chip 300, so as to make the mounting region 120 indicate the mounting position of the second semiconductor chip 300 on the design basis.

Figure 2:
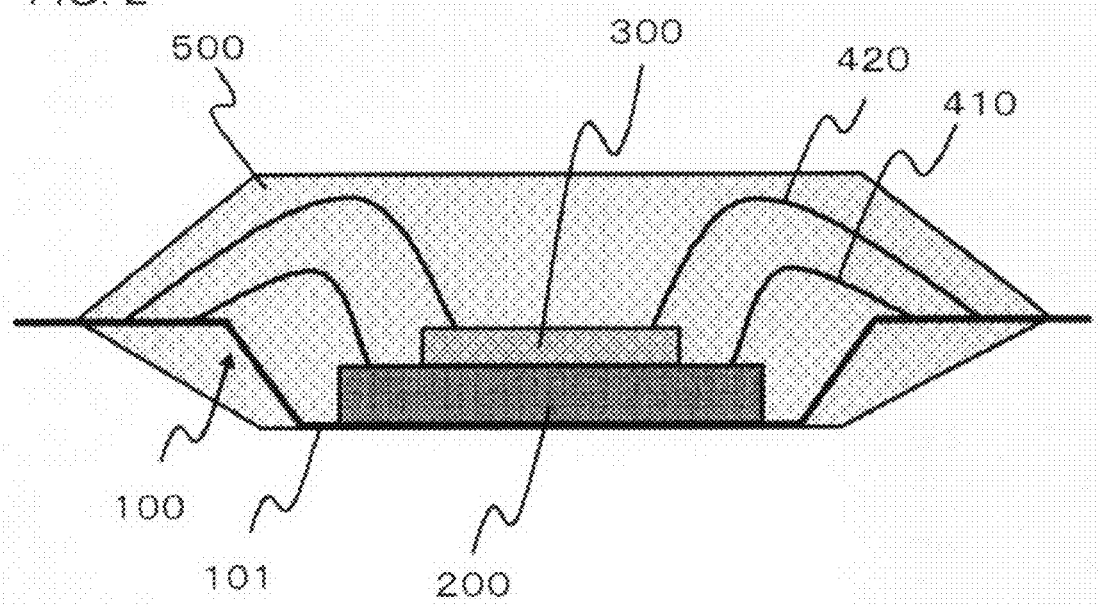
FIG. 2 is a sectional view of the semiconductor device illustrated in FIG. 1.

FIG. 2 is a sectional view of the semiconductor device illustrated in FIG. 1. In addition to the configuration illustrated in FIG. 1, the semiconductor device illustrated in the drawing has wires 410, 420 and an encapsulation resin 500. The wires 410 connect pads (not illustrated) of the first semiconductor chip 200 and inner leads (not illustrated) of the leadframe 100, and the wires 420 connect pads (not illustrated) of the second semiconductor chip 300 and inner leads (not illustrated) of the leadframe 100.

The encapsulation resin 500 encapsulates the surface of the die pad of the leadframe 100, the inner leads, the first semiconductor chip 200, the second semiconductor chip 300, and the wires 410, 420. In this illustrated example, the lower surface of the die pad 101 of the leadframe 100 exposes to the bottom surface of the encapsulation resin 500.

Figure 3:
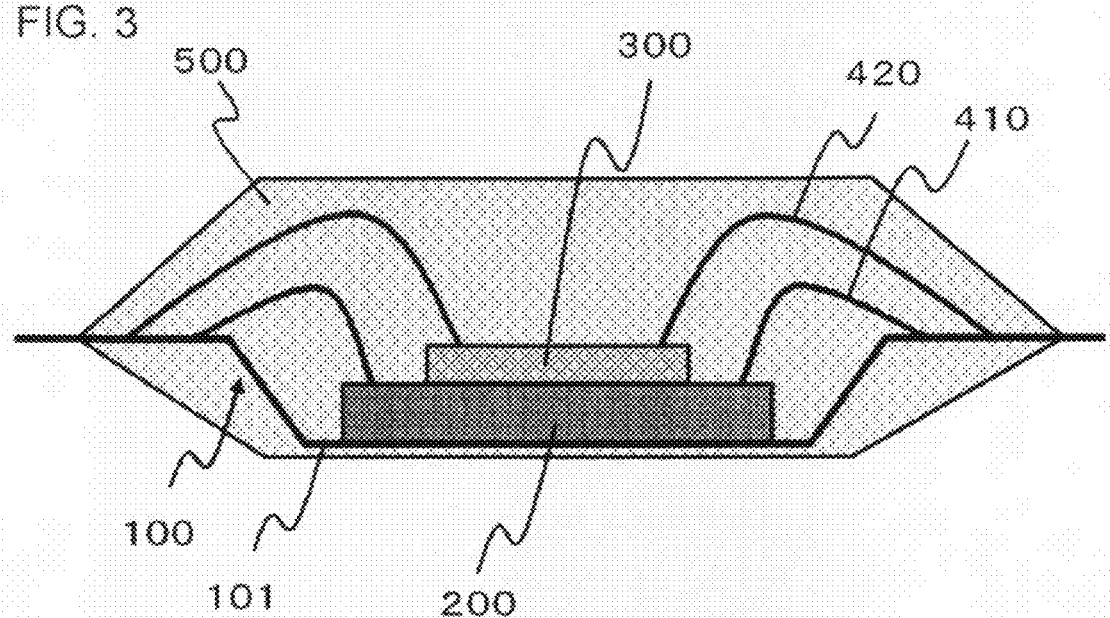
FIG. 3 is a sectional view illustrating a modified example of the semiconductor device illustrated in FIG. 2.

FIG. 3 is a sectional view illustrating a modified example of the semiconductor device illustrated in FIG. 2. The semiconductor device illustrated in the drawing is configured similarly to the semiconductor device illustrated in FIG. 2, except that also the lower surface of the die pad 101 is encapsulated in the encapsulation resin 500.

Paragraphs below will explain a method of manufacturing the semiconductor device illustrated in FIGS. 1 to 3. First, the leadframe 100 is obtained, and the first recesses 112 and the second recesses 122 are formed thereto. The first recesses 112 and the second recesses 122 are formed as impressions, typically by pressing a jig downward against the die pad 101 of the leadframe 100.

For an alternative case where projections are adopted in place of the first recesses 112 and the second recesses 122, the projections are formed as impressions, typically by pressing a jig upward against the die pad 101 of the leadframe 100. For a still alternative case where holes are adopted in place of the first recesses 112 and the second recesses 122, the holes are formed typically by using a punch.

Next, the first semiconductor chip 200 is mounted on the die pad 101, and the second semiconductor chip 300 is further mounted on the first semiconductor chip 200. An apparatus for mounting the first semiconductor chip 200 used herein recognizes the first recesses 112 by image processing or by using a sensor, and determines a mounting position of the first semiconductor chip 200. On the other hand, an apparatus for mounting the second semiconductor chip 300 recognizes the second recesses 122 by image processing or by using a sensor, and determines a mounting position of the second semiconductor chip 300.

Next, the pads of the first semiconductor chip 200 are connected to the inner leads of the leadframe 100 using the wires 410. Furthermore, the pads of the second semiconductor chip 300 are connected to the inner leads of the leadframe 100 using the wires 420.

Next, the mounting position of the first semiconductor chip 200 is visually inspected based on a relative position between the first recesses 112 and the first semiconductor chip 200, and the mounting position of the second semiconductor chip 300 is visually inspected based on a relative position between the second recesses 122 and the second semiconductor chip 300. More specifically, the mounting position of the first semiconductor chip 200 is judged as being correct, if the first semiconductor chip 200 does not fall beyond the mounting region 110 defined by the recesses 112. On the other hand, the mounting position of the second semiconductor chip 300 is judged as being correct, if the second semiconductor chip 300 does not fall beyond the mounting region 120 defined by the second recesses 122.

If both mounting positions of the first semiconductor chip 200 and the second semiconductor chip 300 are judged as being correct, the encapsulation resin 500 is formed using a mold, so as to encapsulate the die pad 101 and the inner leads of the leadframe 100, the first semiconductor chip 200, the second semiconductor chip 300, and the wires 410, 420. For the case where the semiconductor device is configured as illustrated in FIG. 3, and the holes are formed in place of the first recesses 112 and the second recesses 122, the encapsulation resin 500 intrudes also in the holes, to thereby improve adhesiveness between the encapsulation resin 500 and the leadframe 100.

Next, operations and effect of this embodiment will be explained. The first recesses 112 indicate the mounting region 110 for the first semiconductor chip 200, and the second recesses 122 indicate the mounting region 120 for the second semiconductor chip 300. The first recesses 112 and the second recesses 122 are different from each other in at least either one of size and geometry. Accordingly, the mounting region 110 for the first semiconductor chip 200 and the mounting region 120 for the second semiconductor chip 300 may readily be recognized, in whatever cases of adopting the image processing, the sensor and visual inspection.

More specifically, the apparatus for mounting the semiconductor chip onto the die pad 101 may readily recognize the mounting region 110 for the first semiconductor chip 200, and the mounting region 120 for the second semiconductor chip 300. Also for the case where the mounting position of each of the first semiconductor chip 200 and the second semiconductor chip 300 is visually inspected, each of the mounting region 110 for the first semiconductor chip 200 and the mounting region 120 for the second semiconductor chip 300 may readily be recognized.

The first recesses 112 and the second recesses 122 may be formed simply by pressing a jig against the die pad 101, needing only a low cost for forming the first recesses 112 and the second recesses 122.

The first recesses 112 and the second recesses 122, provided so as not to extend through the die pad 101, are contributive to suppress decrease in the strength of the die pad 101, and also to suppress the flatness of the die pad 101 from degrading.

Alternatively by using only a single type of leadframe 100, a first semiconductor device having only the first semiconductor chip 200 mounted on the die pad 101, and a second semiconductor device having only the second semiconductor chip 300 mounted on the die pad 101 may be manufactured. In this way, only a single type of leadframe 100 may be used commonly for the first and second semiconductor devices having different chip sizes. The above-described effects may be obtained also in this case.

Figure 4:
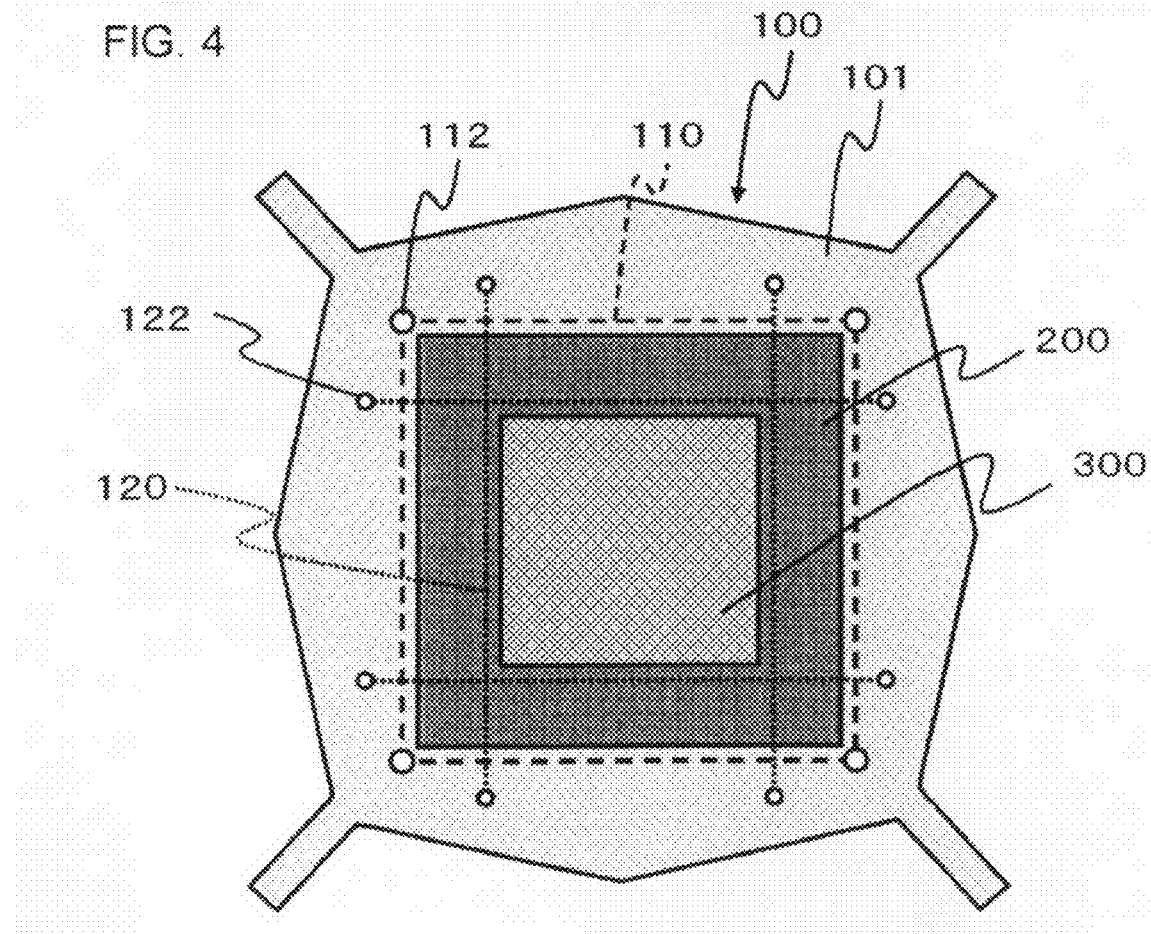
FIG. 4 is a plan view of a semiconductor device according to a second embodiment.

FIG. 4 is a plan view of a semiconductor device according to a second embodiment, and corresponds to FIG. 1 in the first embodiment. The semiconductor device is configured similarly to the semiconductor device explained in the first embodiment, except for the planar geometry of the die pad 101. The die pad 101 of this embodiment has a nearly octagonal geometry.

For the case where the die pad 101 has a non-simple geometry just like this embodiment, it may not be easy to recognize the distance from the edges of the die pad 101 to the first semiconductor chip 200 and to the second semiconductor chip 300. It may therefore be difficult to inspect the mounting position of the first semiconductor chip 200 and the second semiconductor chip 300, based on the distance from the edges of the die pad 101. In contrast in this embodiment, the mounting region 110 for the first semiconductor chip 200 is defined by the first recesses 112, and the mounting region 120 for the second semiconductor chip 300 is defined by the second recesses 122. The mounting positions of the first semiconductor chip 200 and the second semiconductor chip 300 may readily be inspected.

Figure 5:
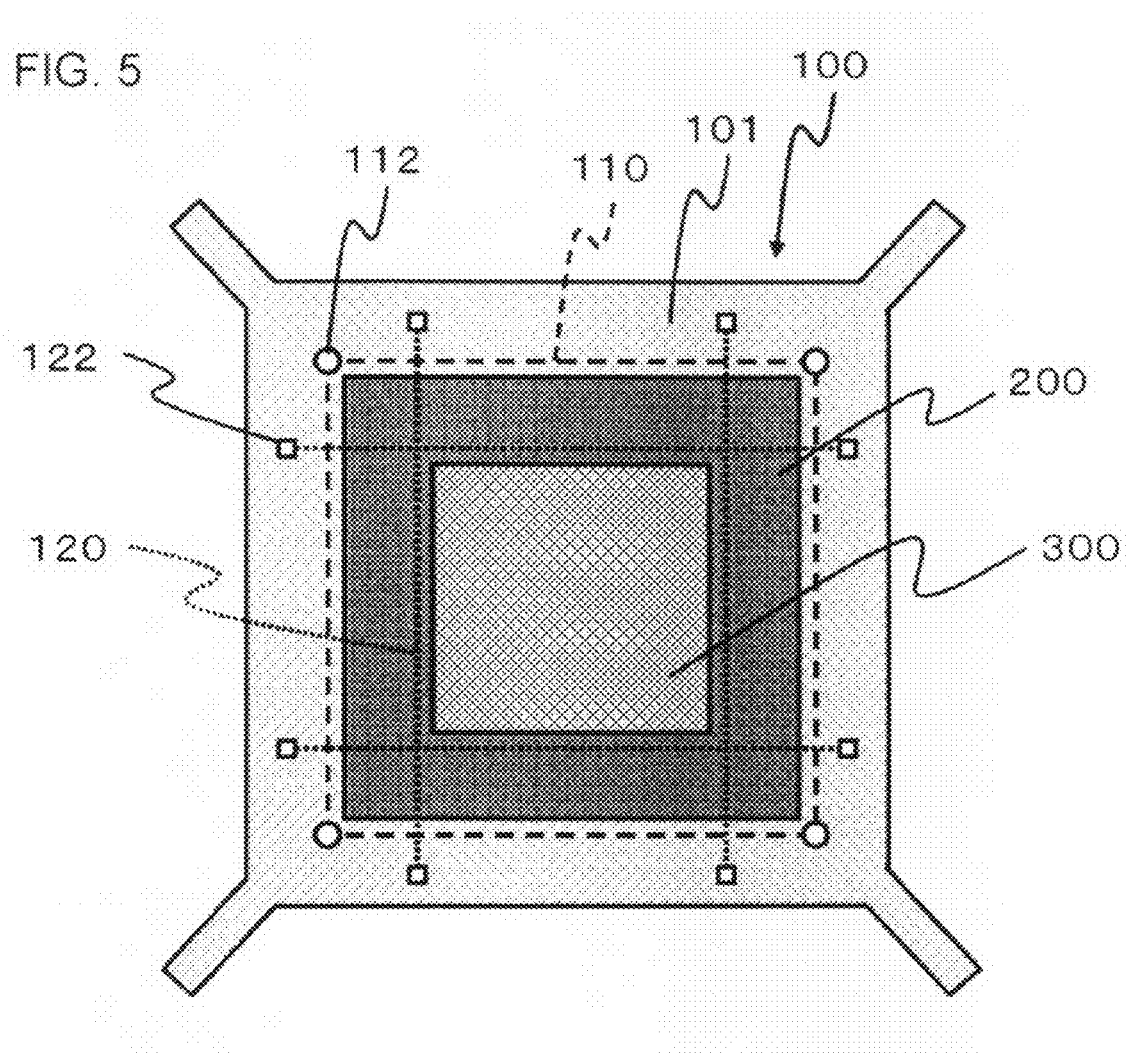
FIG. 5 is a plan view of a semiconductor device according to a third embodiment.

FIG. 5 is a plan view of a semiconductor device according to a third embodiment, and corresponds to FIG. 1 in the first embodiment. The semiconductor device is configured similarly to the semiconductor device explained in the first embodiment, except that the first recesses 112 and the second recesses 122 have different geometries.

The effects similar to those in the first embodiment may be obtained also in this embodiment. Since the first recesses 112 and the second recesses 122 may be formed to have the same size, both of the first recesses 112 and the second recesses 122 may more readily be confirmed by visual inspection.

Figure 6:
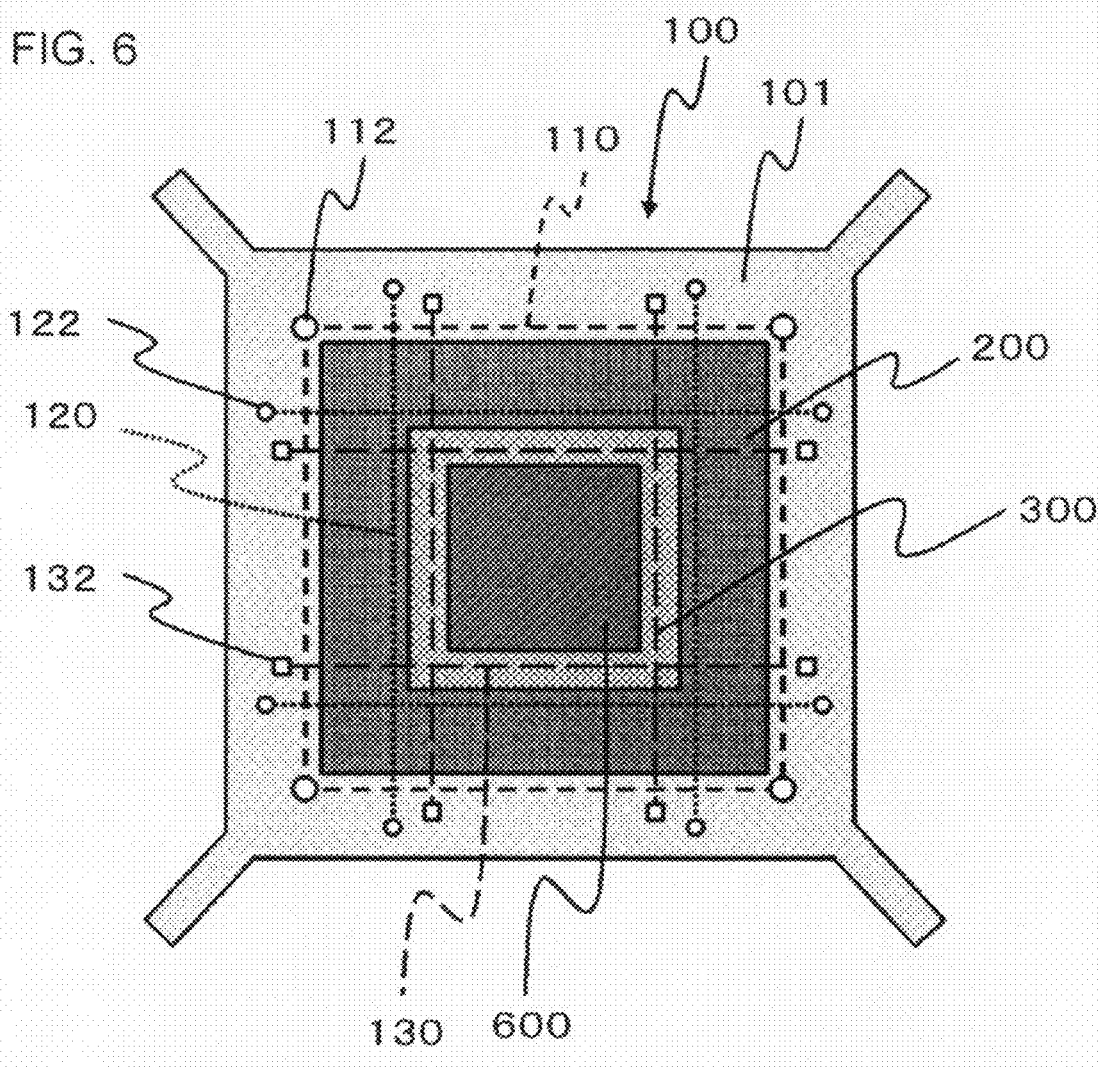
FIG. 6 is a plan view of a semiconductor device according to a fourth embodiment.

FIG. 6 is a plan view of a semiconductor device according to a fourth embodiment, and corresponds to FIG. 1 in the first embodiment. The semiconductor device is configured similarly to the semiconductor device explained in the first embodiment, except that a third semiconductor chip 600 is mounted over the second semiconductor chip 300, and that a plurality of third recesses 132 are formed to the die pad 101. The third recesses 132 may be formed in the same step of forming the first recesses 112 and the second recesses 122.

The third semiconductor chip 600 is smaller than the second semiconductor chip 300. The third recesses 132 are different from both of the first recesses 112 and the second recesses 122, in at least either one of size and geometry. The plurality of third recesses 132 indicate a mounting region 130 for the third semiconductor chip 600. The mounting region 130 is defined by the lines connecting the correspondent third recesses 132 faced each other through the mounting region 120 for the second semiconductor chip 300 in between.

Effects similar to those in the first embodiment may be obtained also in this embodiment. Also mounting and inspection of the mounting position of the third semiconductor chip 600 may be carried out similarly to the mounting and inspection of the mounting positions of the first semiconductor chip 200 and the second semiconductor chip 300.

Figure 7:
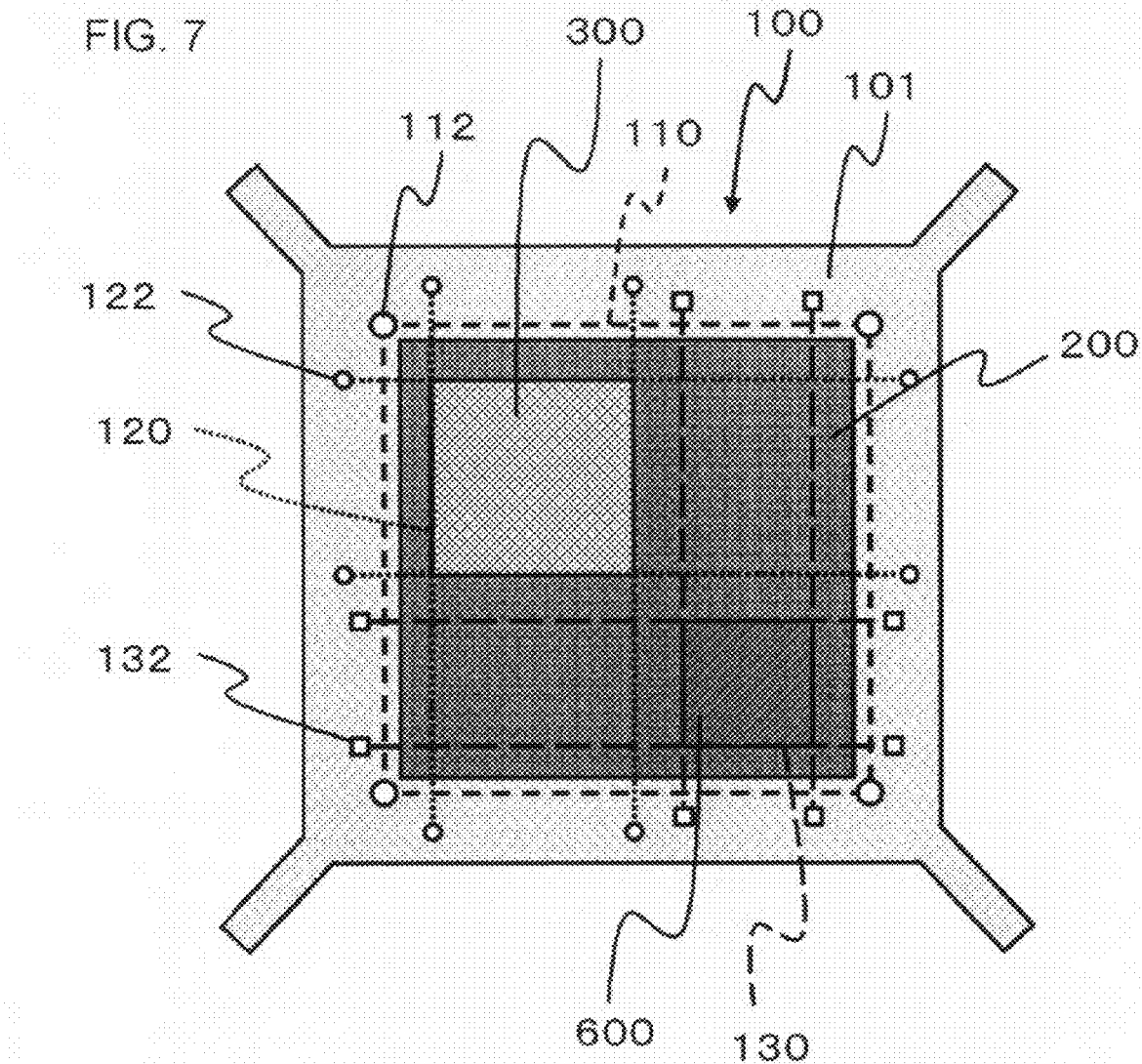
FIG. 7 is a plan view of a semiconductor device according to a fifth embodiment.

FIG. 7 is a plan view of a semiconductor device according to a fifth embodiment, and corresponds to FIG. 6 in the fourth embodiment. The semiconductor device is configured similarly to as described in the fourth embodiment, except that both of the second semiconductor chip 300 and the third semiconductor chip 600 are mounted over the first semiconductor chip 200.

Effects similar to those in the fourth embodiment may be obtained also in this embodiment.

Figure 8:
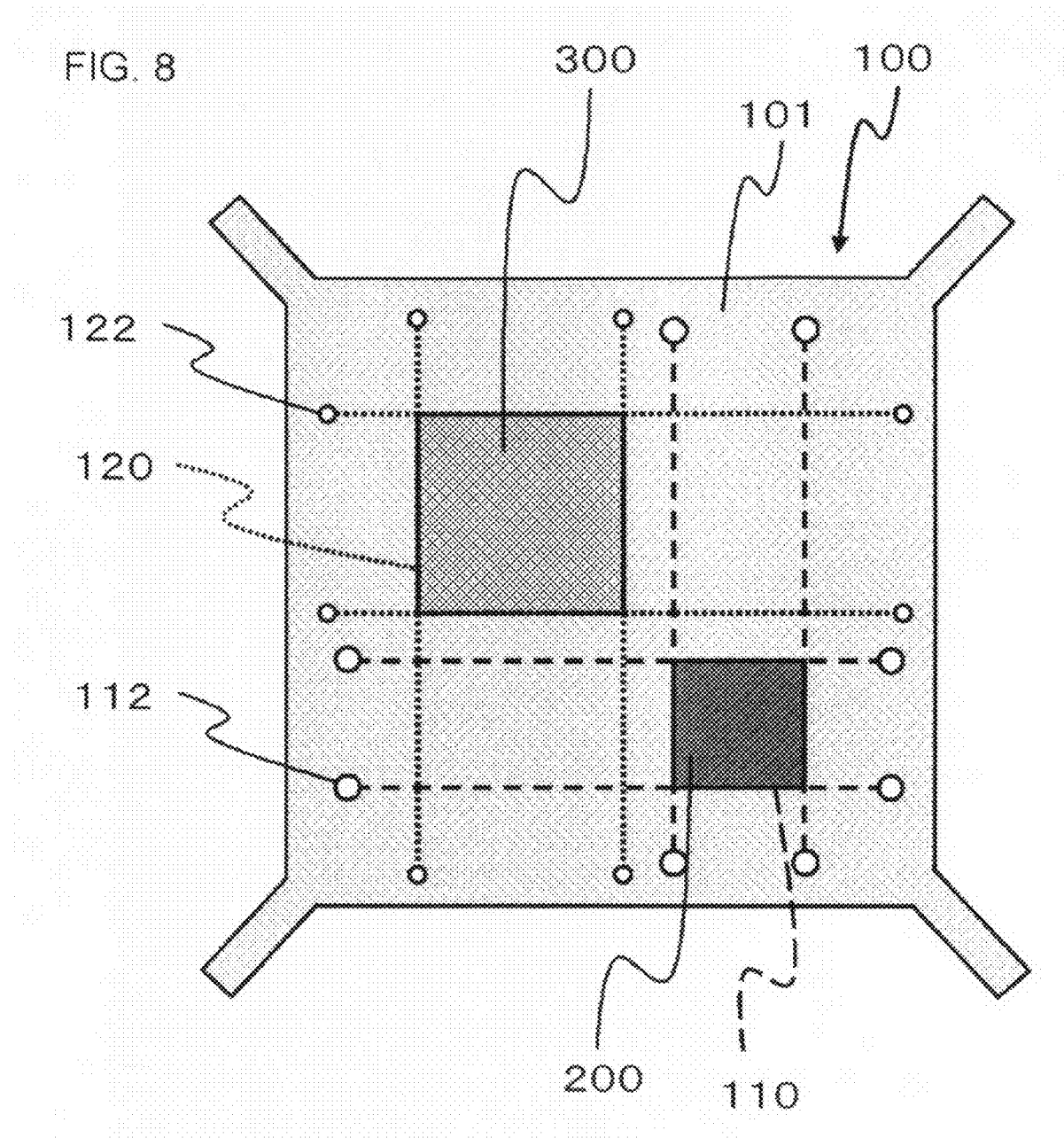
FIG. 8 is a plan view of a semiconductor device according to a sixth embodiment.

FIG. 8 is a plan view of a semiconductor device according to a sixth embodiment, and corresponds to FIG. 1 in the first embodiment. The semiconductor device is configured similarly to as described in the first embodiment, except that the second semiconductor chip 300 is mounted on the die pad 101 of the leadframe 100, rather than on the first semiconductor chip 200.

Effects similar to those in the first embodiment may be obtained also in this embodiment.

Figure 9:
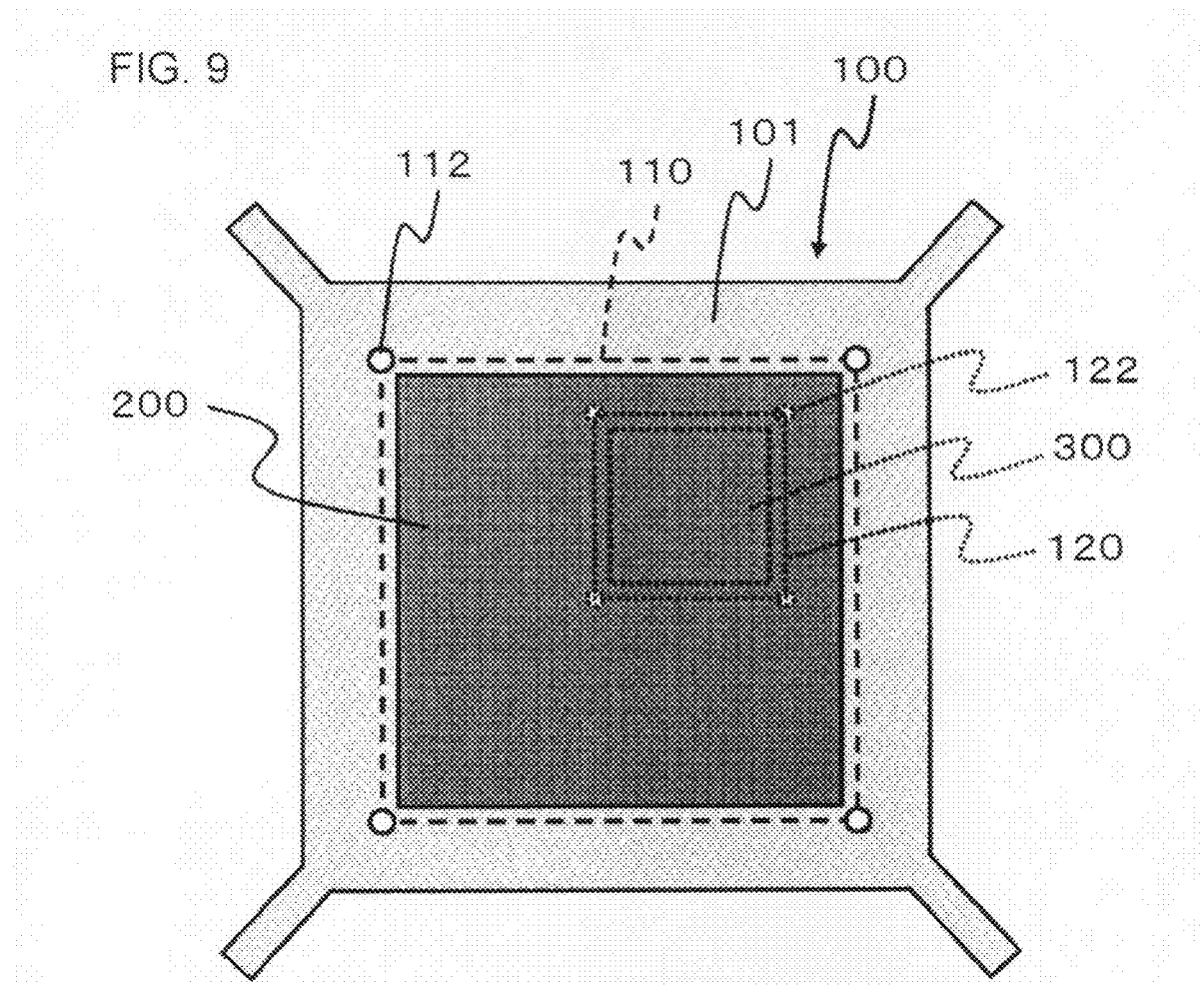
FIG. 9 is a plan view of a semiconductor device according to a seventh embodiment.
Figure 10:
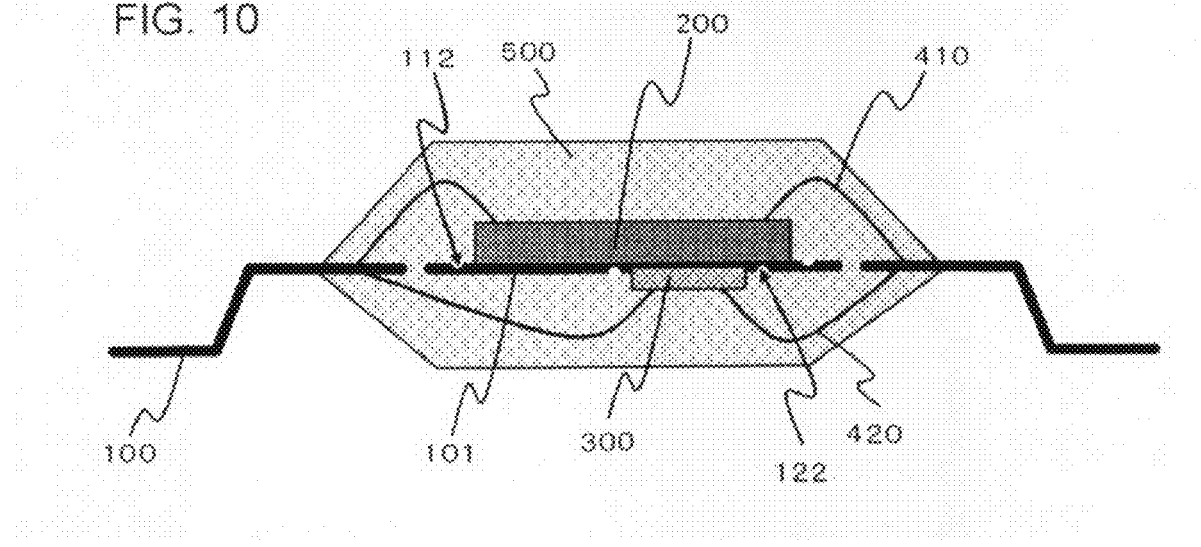
FIG. 10 is a sectional view of the semiconductor device illustrated in FIG. 9.

FIG. 9 is a plan view of a semiconductor device according to a seventh embodiment, and FIG. 10 is a schematic sectional view of the semiconductor device illustrated in FIG. 9. The semiconductor device is configured similarly to as described in the first embodiment, except for the aspects below. First, the first semiconductor chip 200 is mounted on a first surface of the die pad 101 of the leadframe 100, and the second semiconductor chip 300 is mounted on a second surface, which is the surface opposite to the first surface, of the die pad 101. The first recesses 112 are formed to the first surface of the die pad 101, and the second recesses 122 are formed to the second surface of the die pad 101.

According to this embodiment, the first recesses 112 formed to the first surface of the die pad 101 are different from the second recesses 122 formed to the second surface of the die pad 101, in at least either one of size and geometry. Accordingly, the surface to be mounted thereon with the first semiconductor chip 200, and the surface to be mounted thereon with the second semiconductor chip 300 may readily be understood in a respective manner. Therefore, the mounting surface for the first semiconductor chip 200 and the mounting surface for the second semiconductor chip 300 may be less likely to be mistaken.

Figure 11:
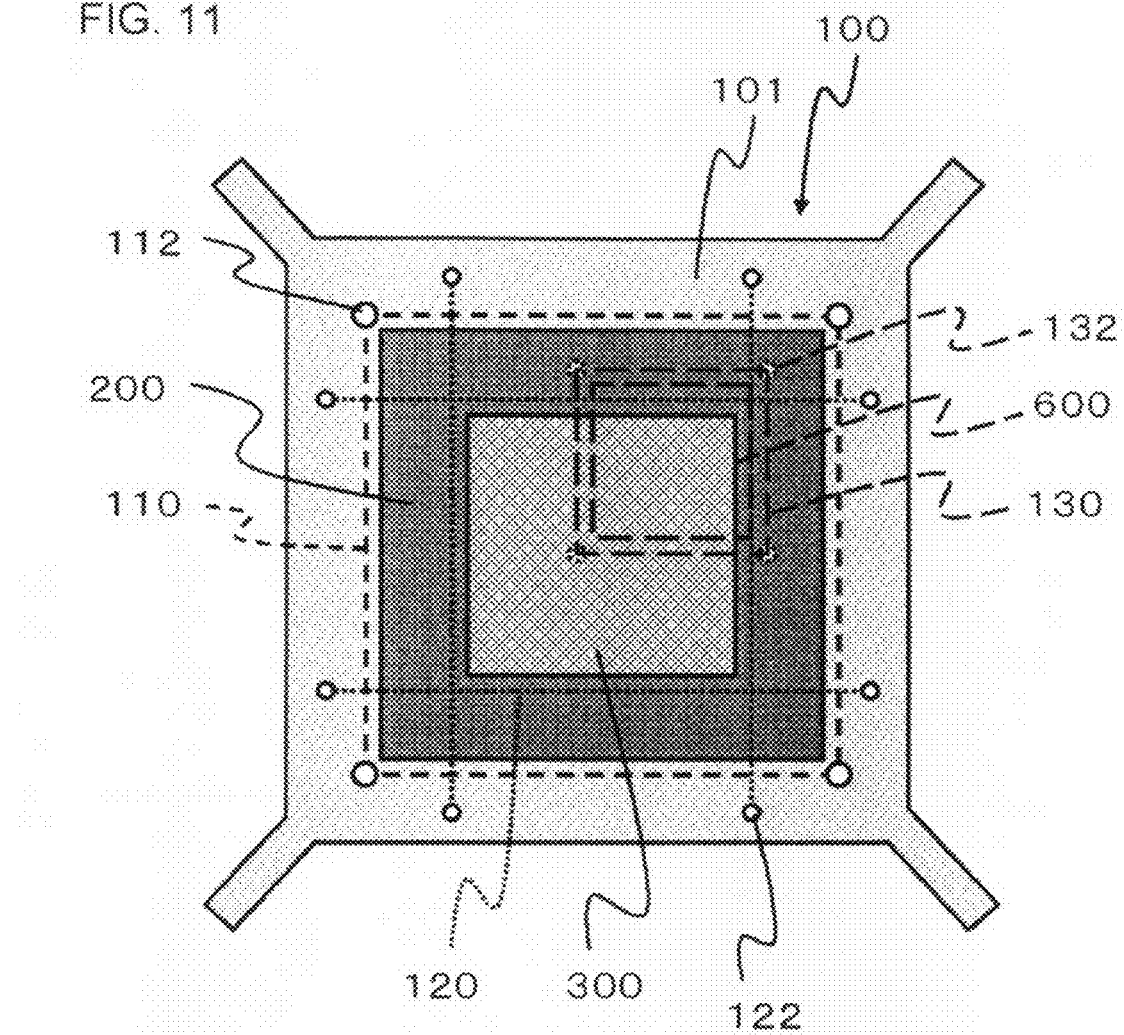
FIG. 11 is a plan view of a semiconductor device according to an eighth embodiment.
Figure 12:
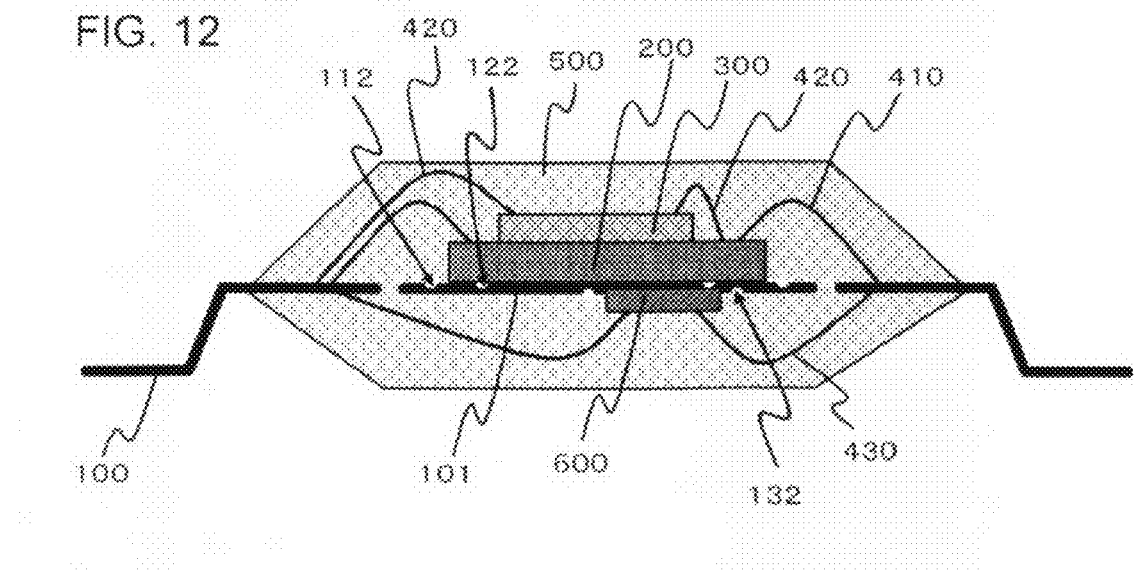
FIG. 12 is a sectional view of the semiconductor device illustrated in FIG. 11.

FIG. 11 is a plan view of a semiconductor device according to an eighth embodiment, and FIG. 12 is a schematic sectional view of the semiconductor device illustrated in FIG. 11. The semiconductor device is configured similarly to as described in the fourth embodiment, except for the aspects below. First, the first surface of the die pad 101 of the leadframe 100 has the first semiconductor chip 200 and the second semiconductor chip 300 mounted thereon. The second surface of the die pad 101, which is the surface opposite to the first surface, has the third semiconductor chip 600 mounted thereon. The first surface of the die pad 101 has also the first recesses 112 and the second recesses 122 formed thereto, and the second surface of the die pad 101 has the third recess 132 formed thereto.

As illustrated in FIG. 12, the second semiconductor chip 300 in this embodiment is directly connected to the leadframe 100 through a part of the wires 420, and connected to the first semiconductor chip 200 through the residual wires 420. The third semiconductor chip 600 is directly connected to the leadframe 100 through wires 430.

Effects similar to those in the fourth embodiment may be obtained also in this embodiment. The first recesses 112 and the second recesses 122 formed to the first surface of the die pad 101 are different from the third recesses 132 formed to the second surface of the die pad 101, in at least either one of size and geometry. Accordingly, the surface to be mounted thereon with the first semiconductor chip 200 and the second semiconductor chip 300, and the surface to be mounted thereon with the third semiconductor chip 600 may readily be recognized in a respective manner. Therefore, the mounting surface for the first semiconductor chip 200 and the second semiconductor chip 300, and the mounting surface for the second semiconductor chip 300 may be less likely to be mistaken.

In the seventh embodiment, the first recesses 112 and the second recesses 122 may have the same geometry and the same size. In the eighth embodiment, the third recesses 132 may have the same size and the same geometry with the first recesses 112 or the second recesses 122.

The embodiments of the present invention have been explained referring to the attached drawings, merely as examples of the present invention, while allowing adoption of various configurations other than those described in the above.

It is apparent that the present invention is not limited to the above embodiments, but may be modified and changed without departing from the scope and spirit of the invention.

What is claimed is:

1. A leadframe, comprising:
   a die pad on which semiconductor chips are mounted;
   a first mark formed to said die pad, for indicating a first mounting region for a first semiconductor chip; and
   a second mark formed to said die pad in a same area as the first mark, for indicating a second mounting region for a second semiconductor chip,
   wherein said first mark is different from said second mark in at least one of either size or geometry.

2. The leadframe as claimed in claim 1, wherein said first mark comprises one of a recess, a projection and a hole, and
   wherein said second mark comprises one of a recess, a projection and a hole.

3. The leadframe as claimed in claim 1, wherein said second semiconductor chip is smaller than said first semiconductor chip, and is mounted over said first semiconductor chip, and
   wherein said second mounting region for said second semiconductor chip is positioned inside said first mounting region for said first semiconductor chip on said die pad.

4. The leadframe as claimed in claim 1, wherein said leadframe comprises a plurality of said first marks and a plurality of said second marks,
   wherein said first mounting region for said first semiconductor chip is defined by first lines connecting every adjacent first marks, and
   wherein said second mounting region for said second semiconductor chip is defined by second lines connecting every correspondent second marks.

5. The leadframe as claimed in claim 3, wherein said leadframe comprises a plurality of said first marks and a plurality of said second marks,
   wherein said first mounting region for said first semiconductor chip is defined by first lines connecting every adjacent first marks, and
   wherein said second mounting region for said second semiconductor chip is defined by second lines connecting every correspondent second marks faced each other through said first mounting region for said first semiconductor chip in between.

6. The leadframe as claimed in claim 1, wherein said first mark is formed to a first surface of said die pad, and
   wherein said second mark is formed to a second surface, opposite to said first surface, of said die pad.

7. The leadframe as claimed in claim 2, wherein said first mark and said second mark are formed to a first surface of said die pad, and
   wherein said leadframe further comprises a third mark, formed to a second surface, opposite to said first surface, of said die pad, for indicating a third mounting region for a third semiconductor chip.

8. A semiconductor device, comprising:
   a leadframe comprising a die pad;
   a first semiconductor chip mounted on said die pad of said leadframe;
   a first mark formed to said die pad and for indicating a mounting region of a first semiconductor chip; and
   a second mark formed to said die pad and for indicating a mounting region of a second semiconductor chip,
   wherein said first mark is different from said second mark in at least either one of size and geometry.

9. The semiconductor device according to claim 8, further comprising an encapsulating resin to encapsulate a surface of the die pad of the leadframe and the first semiconductor chip.

10. The semiconductor device according to claim 8, further comprising bonding wires configured to electrically associate said first semiconductor chip to said die pad.

11. The semiconductor device as claimed in claim 8, further comprising an encapsulating resin to encapsulate said first semiconductor chip,
    wherein a lower surface of said die pad is exposed to said encapsulating resin.

12. The semiconductor device as claimed in claim 8, wherein a plan geometry of said die pad comprises an octagonal geometry.

13. The semiconductor device as claimed in claim 8, wherein, in a plan view, said first mark and said second mark are both positioned between said first semiconductor chip and edges of said die pad.

14. The semiconductor device as claimed in claim 8, wherein the mounting region of said first semiconductor chip is defined by four of said first marks, and
    wherein the mounting region of said second semiconductor chip is defined by eight of said second marks.

15. The semiconductor device as claimed in claim 8, wherein the mounting region of said first semiconductor chip is defined by a square formed by a top of four of said first marks.

16. The semiconductor device as claimed in claim 8, wherein said first mark comprises one of a recess, a projection, and a hole, and
wherein said second mark comprises one of a recess, a projection, and a hole.

17. The semiconductor device as claimed in claim 8, wherein said second semiconductor chip is smaller than said first semiconductor chip, and is mounted over said first semiconductor chip, and
wherein said second mounting region for said second semiconductor chip is positioned inside said first mounting region for said first semiconductor chip on said die pad.

18. The semiconductor device as claimed in claim 8, wherein said leadframe further comprises a plurality of said first marks and a plurality of said second marks,
wherein said first mounting region for said first semiconductor chip is defined by first lines connecting every adjacent one of the plurality of said first marks, and
wherein said second mounting region for said second semiconductor chip is defined by second lines connecting every corresponding one of the plurality of said second marks.

19. The semiconductor device as claimed in claim 17, wherein said leadframe further comprises a plurality of said first marks and a plurality of said second marks,
wherein said first mounting region for said first semiconductor chip is defined by first lines connecting every adjacent one of the plurality of said first marks, and
wherein said second mounting region for said second semiconductor chip is defined by second lines connecting every corresponding one of the plurality of said second marks facing each other through said first mounting region for said first semiconductor chip in between.

20. The semiconductor device as claimed in claim 8, wherein said first mark is formed to a first surface of said die pad, and
wherein said second mark is formed to a second surface, opposite to said first surface, of said die pad.

21. The semiconductor device as claimed in claim 8, wherein a first line connecting a first said second mark and a second said second mark and a second line connecting a third said second mark and a fourth said second mark are configured to not intersect each other on said die pad,
wherein a third line connecting a fifth said second mark and a sixth said second mark and a fourth line connecting a seventh said second mark and a eighth said second mark are configured to not intersect each other on said die pad, and said third line and said fourth line are configured to intersect said first line and said second line, and
wherein said mounting region of said second semiconductor chip is defined as an area surrounded by said first lines, said second lines, said third lines, and said fourth lines.

22. The semiconductor device as claimed in claim 17, further comprising:
an encapsulating resin to encapsulate a surface of the die pad of the leadframe and the first semiconductor chip; and
bonding wires configured to electrically associate said first semiconductor chip to said die pad.

23. The semiconductor device as claimed in claim 8, further comprising:
an encapsulating resin to encapsulate a surface of the die pad of the leadframe and the first semiconductor chip; and
bonding wires configured to electrically associate said first semiconductor chip to said die pad,
wherein said second semiconductor chip is smaller than said first semiconductor chip, and
wherein said mounting region of said second semiconductor chip is positioned outside said mounting region of said first semiconductor chip on said die pad.

24. A leadframe, comprising:
a die pad for mounting semiconductor chips;
a first mark formed to a first surface of said die pad, for indicating a first mounting region for a first semiconductor chip; and
a second mark formed to a second surface, opposite to said first surface, of said die pad, for indicating a second mounting region for a second semiconductor chip,
wherein said first mark is different from said second mark in size.

25. The leadframe according to claim 24, wherein the first mark is positioned outside the first mounting region.

26. The leadframe according to claim 24, wherein the second mark is positioned outside the second mounting region.

27. A leadframe, comprising:
a die pad for mounting semiconductor chips;
a first mark formed to a first surface of said die pad, for indicating a first mounting region for a first semiconductor chip; and
a second mark formed to a second surface, opposite to said first surface, of said die pad, for indicating a second mounting region for a second semiconductor chip,
wherein said first mark is different from said second mark in geometry.

28. The leadframe according to claim 27, wherein a geometry of said first mark comprises a one of a square and a circle opposite from a geometry of said second mark, and
wherein said second mark comprises one of a square and a circle.

29. A semiconductor device, comprising:
a die pad;
a plurality of first marks formed on said die pad and comprising a first geometry;
a plurality of second marks formed on said die pad and comprising a second geometry; and
a first semiconductor chip mounted on said die pad,
wherein said first mark and said second mark comprise at least one different size or geometry, and
wherein, in a plan view, said first semiconductor chip is positioned in a first region defined as an area surrounded by each junction adjacent to said first mark.

30. The semiconductor device as claimed in claim 29, wherein said first mark comprises one of a recess, a projection, or a hole, and
wherein said second mark comprises one of a recess, a projection, or a hole.

31. The semiconductor device as claimed in claim 29, further comprising an encapsulating resin to encapsulate said first semiconductor chip,
wherein a lower surface of said die pad is exposed to said encapsulating resin.

32. The semiconductor device as claimed in claim 29, wherein a plan geometry of said die pad comprises an octagonal geometry.

33. The semiconductor device as claimed in claim 29, wherein a first line connecting a first one of said second marks and a second one of said second marks and a second line connecting a third one of said second marks and a fourth one of said second marks are configured to not intersect each other on said die pad,
- wherein a third line connecting a fifth one of said second marks and a sixth one of said second marks and a fourth line connecting a seventh one of said second marks and a eighth one of said second marks are configured to not intersect each other on said die pad,
- wherein said third line and said fourth line are configured to intersect said first line and said second line, and
- wherein said semiconductor device further comprises a second semiconductor chip mounted on a second region of said die pad, said second region being defined as an area surrounded by said first lines, said second lines, said third lines, and said fourth lines.

34. The semiconductor device as claimed in claim 33, wherein, in a plan view, a center of gravity of said first region and a center of gravity of said second region are not connected,
- wherein said center of gravity of said first region and a center of gravity of said first semiconductor chip are configured to overlap, and
- wherein said center of gravity of said second region and a center of gravity of said second semiconductor chip are configured to overlap.

35. The semiconductor device as claimed in claim 29, wherein said first mark and said second mark delineate two different regions comprising said first region and a second region.

36. The semiconductor device as claimed in claim 35, wherein said semiconductor device further comprises a second semiconductor chip mounted on said second region of said die pad.

* * * * *